(12) United States Patent
Chang et al.

(10) Patent No.: US 8,592,671 B2
(45) Date of Patent: Nov. 26, 2013

(54) DATA CENTER AND AUXILIARY POWER SUPPLY UNIT THEREOF

(75) Inventors: Yao-Ting Chang, Taipei Hsien (TW); Chao-Ke Wei, Taipei Hsien (TW); Hung-Chou Chan, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 476 days.

(21) Appl. No.: 12/889,426

(22) Filed: Sep. 24, 2010

(65) Prior Publication Data

US 2012/0049783 A1  Mar. 1, 2012

(30) Foreign Application Priority Data

Aug. 27, 2010  (TW) ................. 99128774 A

(51) Int. Cl.
*H01L 35/30* (2006.01)
*H01M 10/44* (2006.01)

(52) U.S. Cl.
USPC .............. 136/205; 136/200; 136/201; 62/3.7; 320/101

(58) Field of Classification Search
USPC ........................................... 320/101; 136/205
See application file for complete search history.

(56) References Cited

U.S. PATENT DOCUMENTS 6,166,317 A * 12/2000 Volk, Jr. ......................... 136/201
2008/0022696 A1 * 1/2008 Welle et al. ...................... 62/3.7
2009/0293124 A1 * 11/2009 Wang .............................. 726/23

* cited by examiner

*Primary Examiner* — Edward Tso
*Assistant Examiner* — Johali Torres Ruiz
(74) *Attorney, Agent, or Firm* — Altis & Wispro Law Group, Inc.

(57) ABSTRACT

An auxiliary power supply unit of a data center includes a thermoelectric chip module and a direct current/alternating current (DC/AC) voltage converter connected to the thermoelectric chip module. The thermoelectric chip module includes a number of thermoelectric chips. At least one sidewall of each thermoelectric chip contacts a hot pipe of the data center. The thermoelectric chips generate a direct current (DC) voltage when a temperature difference between the sidewalls of each thermoelectric chip exists. The DC/AC voltage converter converts the DC voltage into an alternating current (DC) voltage to power an air treatment device of the data center.

8 Claims, 3 Drawing Sheets

DATA CENTER AND AUXILIARY POWER SUPPLY UNIT THEREOF

BACKGROUND

1. Technical Field

The present disclosure relates to data centers, and more particularly to a data center including an auxiliary power supply unit.

2. Description of Related Art

To keep a suitable inside temperature (such as 18° C.-27° C.) of a data center, an air filtering and dehumidifying device is often applied. However, filtering and dehumidifying devices consume a lot of power.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
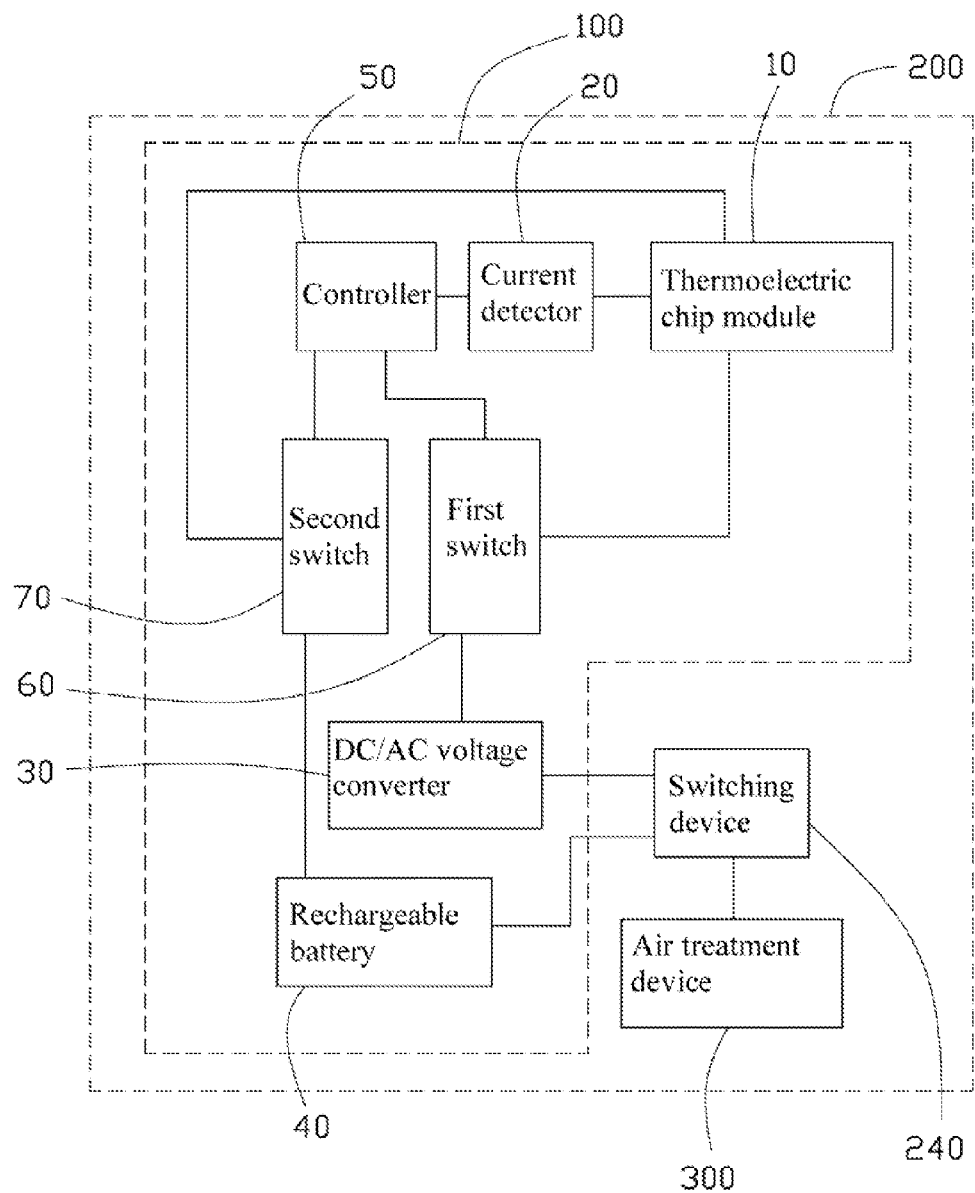
FIG. 1 is a block diagram of an exemplary embodiment of a data center, and the data center includes an auxiliary power supply unit.
Figure 2:
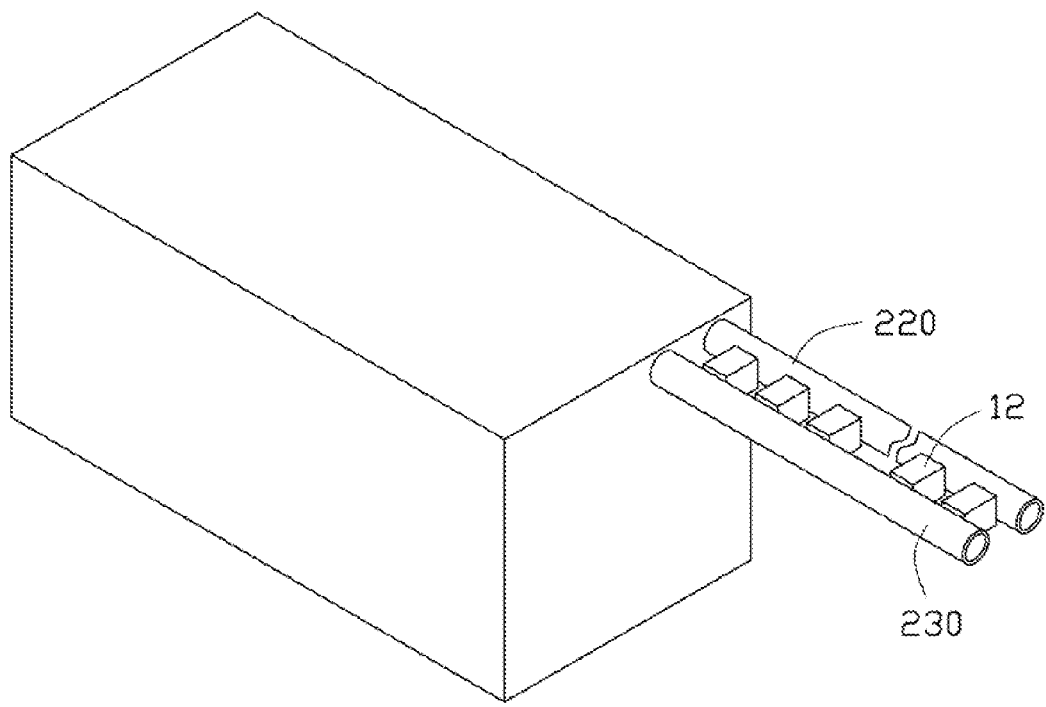
FIG. 2 is a schematic view of the data center of FIG. 1 in a first mode.

Referring to FIGS. 1 and 2, an exemplary embodiment of a data center includes an auxiliary power unit 100, an air treatment device 300, for filtering and dehumidifying air, connected to the auxiliary power supply unit 100, a hot pipe 220, a cold air inlet pipe 230, and a switching device 240. The auxiliary power supply unit 100 includes a thermoelectric chip module 10, a current detector 20, a direct current/alternating current (DC/AC) voltage converter 30, a rechargeable battery 40, a controller 50, a first switch 60, and a second switch 70. The thermoelectric chip module 10 includes a plurality of thermoelectric chips 12 connected in series.

Figure 3:
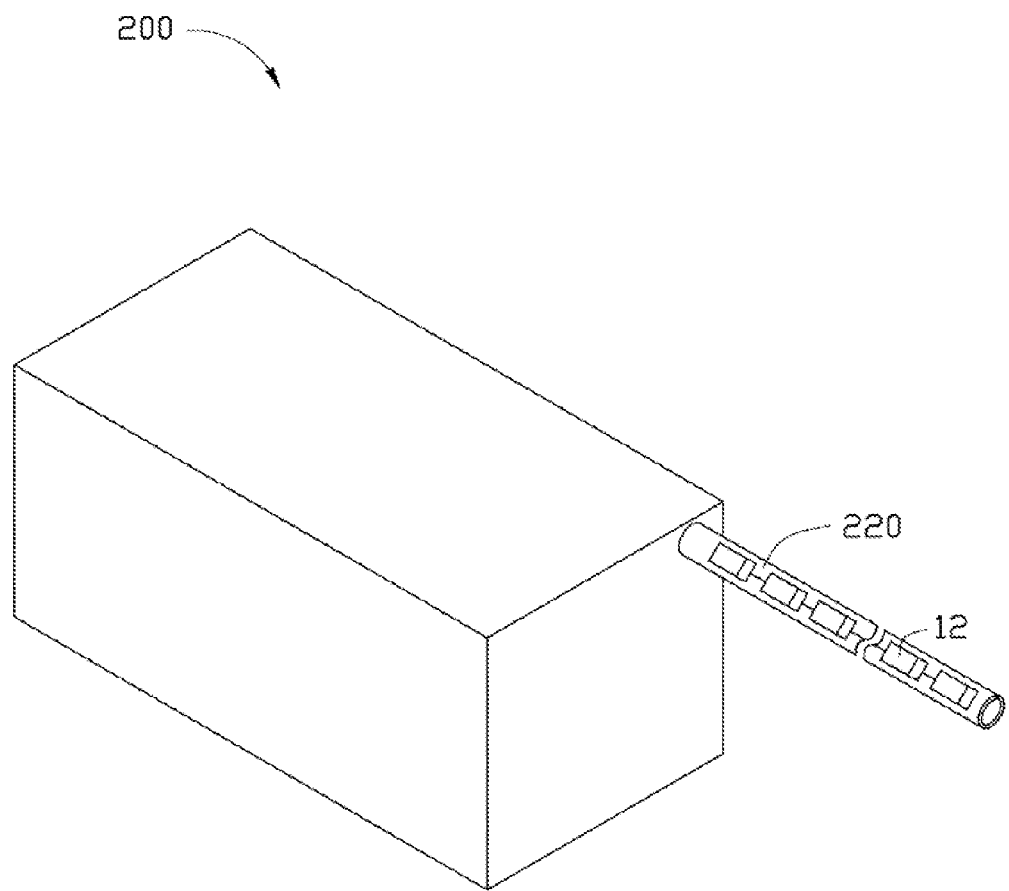
FIG. 3 is a schematic view of the data center of FIG. 1 in a second mode.

In a first mode, a first sidewall and a second sidewall of each thermoelectric chip 12 respectively contact the hot pipe 220 and the cold pipe 230. Each thermoelectric chip 12 can generate a direct current (DC) voltage when a temperature difference between the first sidewall and the second sidewall exists. Referring to FIG. 3, in a second mode, one sidewall of each thermoelectric chip 12 contacts the hot pipe 220. Each thermoelectric chip 12 generates a direct current (DC) voltage when a temperature difference exists between the sidewalls thereof.

The current detector 20 is connected between the thermoelectric chip module 10 and the controller 50, to detect a current output from the thermoelectric chip module 10 and output the detected current value to the controller 50. The first switch 60 is connected between the thermoelectric chip module 10 and the DC/AC converter 30. The second switch 70 is connected between the thermoelectric chip module 10 and the rechargeable battery 40. The controller 50 is connected to the first and second switches 60 and 70. The switching device 240 is connected between the rechargeable battery 40 and the DC/AC voltage convertor 30. The switching device 240 is also connected between the air treatment device 300 and the DC/AC voltage convertor 30. The current detector 20, the DC/AC voltage converter 30, the first and second switches 60 and 70, and the controller 50 are powered by the data center.

In use, the thermoelectric chips 12 output the DC voltages when temperature differences thereof exist. The current detector 20 detects the resulting current output from the thermoelectric chip module 10, and outputs the detected current value to the controller 50. The controller 50 compares the detected current value with a predetermined current value to evaluate a load capacity of the thermoelectric chip module 10. If the detected current value is greater than or equal to the predetermined current value, it denotes that the thermoelectric chip module 10 is capable of supplying power to the air treatment device 300. The controller 50 turns on the first switch 60, and turns off the second switch 70. Thus, the thermoelectric chip module 10 outputs the DC voltage to the DC/AC voltage convertor 30. The DC/AC voltage convertor 30 converts the DC voltage into an alternating current (AC) voltage, and outputs the AC voltage to power the air treatment device 300 through the switching device 240. If the detected current value is less than the predetermined current value, it denotes that the thermoelectric chip module 10 is incapable of powering the air treatment device 300. The controller 50 turns on the second switch 70, and turns off the first switch 60. The thermoelectric chip module 10 is set to charge the rechargeable battery 40 instead. In the embodiment, the rechargeable battery 40 is an uninterrupted power supply. An accumulated power of the rechargeable battery 40 is capable of powering the air treatment device 300 through the switching device 240.

If the thermoelectric chip module 10 is capable of generating enough power to power the air treatment device 300, the current detector 20, the control 50, the storage device 40, the first and second switch 60 and 70, and the switching device 240 can be omitted. That is, the thermoelectric chip module 10 is directly connected to the air treatment device 300 through the DC/AC voltage converter 30 to directly power the air treatment device 300.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. An auxiliary power supply unit of a data center comprising:

a thermoelectric chip module comprising a plurality of thermoelectric chips, wherein at least one of sidewalls of each thermoelectric chip contacts a hot pipe of the data center, the thermoelectric chip generates a direct current (DC) voltage when a temperature difference between the sidewalls of each thermoelectric chip exist;

a direct current/alternating current (DC/AC) voltage converter connected to the thermoelectric chip module to convert the DC voltage into an alternating current (DC) voltage to power an air treatment device of the data center;

a current detector connected to the thermoelectric chip module to detect a current output from the thermoelectric chip module and output a current value;

a rechargeable battery connected to a switching device of the data center and the DC/AC voltage convertor connected to the thermoelectric chip module through the switching device;

a first switch connected between the thermoelectric chip module and the DC/AC voltage convertor;

a second switch connected between the thermoelectric chip module and the rechargeable battery; and a controller connected to the current detector to receive the current value and compare the detected current value with a predetermined value to evaluate a load capacity of the thermoelectric chip module, and the controller further connected to the first switch and the second switch;

wherein if the detected current value is greater than or equal to the predetermined value, the controller turns on the first switch and turns off the second switch, the thermoelectric chip module outputs the DC voltage to the DC/AC voltage converter to power the air treatment device through the switch device, if the detected current value is less than the predetermined current value, the controller turns on the second switch and turns off the first switch, the thermoelectric chip module charges the rechargeable battery, the rechargeable battery powers the air treatment device through the switch device.

2. The auxiliary power supply unit of claim 1, wherein the thermoelectric chip module comprises a plurality of thermoelectric chips connected in series.

3. The auxiliary power supply unit of claim 1, wherein each thermoelectric chip comprises a first sidewall, and a second sidewall opposite to the first sidewall, the first and second sidewalls of the thermoelectric chip respectively contact a cold pipe of the data center and the hot pipe of the data center.

4. The auxiliary power supply unit of claim 1, wherein the rechargeable battery is an uninterrupted power supply.

5. A data center comprising:
a hot pipe;
a cold pipe;
an air treatment device;
an auxiliary power supply unit capable of powering the air treatment device, the auxiliary power supply unit comprising:
a thermoelectric chip module comprising a plurality of thermoelectric chips, wherein at least one of sidewalls of each thermoelectric chip contacts a hot pipe of the data center, the thermoelectric chip generates a direct current (DC) voltage when a temperature difference between the sidewalls of each thermoelectric chip exist; and a direct current/alternating current (DC/AC) voltage converter connected to the thermoelectric chip module to convert the DC voltage into an alternating current (DC) voltage to power an air treatment device of the data center;

a current detector connected to the thermoelectric chip module to detect a current output from the thermoelectric chip module and output a current value;

a rechargeable battery connected to a switching device of the data center and the DC/AC voltage convertor connected to the thermoelectric chip module through the switching device;

a first switch connected between the thermoelectric chip module and the DC/AC voltage convertor;

a second switch connected between the thermoelectric chip module and the rechargeable battery; and a controller connected to the current detector to receive the current value and compare the detected current value with a predetermined value to evaluate a load capacity of the thermoelectric chip module, and the controller further connected to the first switch and the second switch;

wherein when the detected current value is greater than or equal to the predetermined value, the controller turns on the first switch and turns off the second switch, the thermoelectric chip module outputs the DC voltage to the DC/AC voltage converter to power the air treatment device through the switch device, and when the detected current value is less than the predetermined current value, the controller turns on the second switch and turns off the first switch, the thermoelectric chip module charges the rechargeable battery, the rechargeable battery powers the air treatment device through the switch device.

6. The data center of claim 5, wherein the thermoelectric chip module comprises a plurality of thermoelectric chips connected in series.

7. The data center of claim 6, wherein each thermoelectric chip comprises a first sidewall, and a second sidewall opposite to the first sidewall, the first and second sidewalls of the thermoelectric chip respectively contact a cold pipe of the data center and the hot pipe of the data center.

8. The data center of claim 5, wherein the rechargeable battery is an uninterrupted power supply.

* * * * *